United States Patent
Takahashi

(10) Patent No.: US 7,880,227 B2
(45) Date of Patent: Feb. 1, 2011

(54) TRENCH SEMICONDUCTOR DEVICE OF IMPROVED VOLTAGE STRENGTH

(75) Inventor: Tetsuya Takahashi, Saitama (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 12/364,353

(22) Filed: Feb. 2, 2009

(65) Prior Publication Data

US 2009/0173995 A1    Jul. 9, 2009

Related U.S. Application Data

(63) Continuation of application No. 11/507,423, filed on Aug. 21, 2006, now Pat. No. 7,521,755.

(30) Foreign Application Priority Data

Aug. 26, 2005    (JP) .............................. 2005-245533

(51) Int. Cl.
*H01L 29/94* (2006.01)

(52) U.S. Cl. ............... 257/330; 257/409; 257/E29.197; 257/E29.2

(58) Field of Classification Search ................. 257/213, 257/E27.091, E21.015, E21.017, E21.205
See application file for complete search history.

(56) References Cited

U.S. PATENT DOCUMENTS

| | | | | |
|---|---|---|---|---|
| 5,173,756 A | * | 12/1992 | Wong et al. ................... | 257/243 |
| 5,225,697 A | * | 7/1993 | Malhi et al. .................. | 257/302 |
| 5,316,959 A | * | 5/1994 | Kwan et al. .................. | 438/270 |
| 5,329,142 A | * | 7/1994 | Kitagawa et al. ............. | 257/139 |
| 5,448,083 A | * | 9/1995 | Kitagawa et al. ............. | 257/139 |
| 5,466,625 A | * | 11/1995 | Hsieh et al. .................. | 438/155 |
| 5,895,946 A | * | 4/1999 | Hamamoto et al. ......... | 257/302 |
| 5,907,776 A | * | 5/1999 | Hshieh et al. ................ | 438/270 |
| 6,051,468 A | * | 4/2000 | Hshieh ........................ | 438/270 |
| 6,503,818 B1 | | 1/2003 | Jang | |
| 6,541,817 B1 | * | 4/2003 | Hurkx et al. ................. | 257/330 |
| 6,649,975 B2 | * | 11/2003 | Baliga ......................... | 257/330 |
| 6,855,981 B2 | * | 2/2005 | Kumar et al. ................ | 257/328 |
| 7,037,788 B2 | * | 5/2006 | Ito et al. ...................... | 438/268 |
| 7,504,690 B2 | * | 3/2009 | Kelly et al. .................. | 257/328 |
| 7,674,682 B2 | * | 3/2010 | Burke et al. ................. | 438/396 |
| 2004/0166637 A1 | * | 8/2004 | Ito et al. ...................... | 438/270 |
| 2007/0052014 A1 | * | 3/2007 | Takahashi .................... | 257/330 |
| 2009/0053880 A1 | * | 2/2009 | Manabe ....................... | 438/524 |

FOREIGN PATENT DOCUMENTS

| | | |
|---|---|---|
| JP | 09-283754 A | 10/1997 |
| JP | 09283754 A * | 10/1997 |

* cited by examiner

*Primary Examiner*—Leonardo Andújar
*Assistant Examiner*—William Harriston
(74) *Attorney, Agent, or Firm*—Woodcock Washburn LLP

(57) ABSTRACT

A trench IGBT is disclosed which includes a semiconductor substrate having formed therein a set of cell trenches formed centrally and a set of annular guard trenches concentrically surrounding the cell trenches. The cell trenches receive cell trench conductors via cell trench insulators for providing IGBT cells. The guard trenches receive guard trench conductors via guard trench insulators for enabling the IGBT to withstand higher voltages through mitigation of field concentrations. Capacitive coupling conductors overlie the guard trench conductors via a dielectric layer, each for capacitively coupling together two neighboring ones of the guard trench conductors. The capacitive coupling conductors are easily adjustably variable in shape, size and placement relative to the guard trench conductors for causing the individual guard trench conductors to possess potentials for an optimal contour of the depletion layer.

9 Claims, 9 Drawing Sheets

TRENCH SEMICONDUCTOR DEVICE OF IMPROVED VOLTAGE STRENGTH

CROSS REFERENCE TO RELATED APPLICATIONS

This application is a continuation of U.S. patent application Ser. No. 11/507,423 filed Aug. 21, 2006 which claims priority to Japanese Patent Application No. 2005-245533, filed Aug. 26, 2005.

BACKGROUND OF THE INVENTION

This invention relates to semiconductor devices as typified by insulated gate bipolar transistors (IGBTs), and particularly to those having guard trenches, in addition to cell trenches, etched into the semiconductor substrate for higher voltage strength. The invention also specifically pertains to a method of fabricating such trench semiconductor devices.

IGBTs have been known which are cell-trenched to withstand higher voltages, as disclosed for example in Japanese Unexamined Patent Publication No. 9-283754. The cell trenches accommodate gate electrodes via insulators.

The same unexamined patent application also teaches how to improve the voltage strength of the IGBT at the periphery of the semiconductor substrate around the group of IGBT trench cells placed centrally thereon. Employed to this end are several annular guard trenches arranged concentrically along the substrate periphery so as to surround the cell cells. Each guard trench receives a guard trench conductor via an insulator (dielectric). All the guard trench conductors are electrically interconnected via semi-insulators. Like the more conventional guard ring technology, the guard trenches with the guard trench conductors therein function to mitigate field concentrations at the substrate periphery, where the pn junction of the semiconductor device terminates, and hence to enable the device to withstand higher voltages.

The guard trench structure possesses some distinct advantages over the guard ring technology. First of all, in cases where relatively deep cell trenches are etched centrally in the semiconductor substrate for switching applications, the guard rings must be of matching depth. However, being created by diffusion of a conductivity type determinant into the semiconductor substrate, such deep guard rings become unnecessarily wide as a result of inevitable lateral, in addition to desired depth-wise, diffusion of the conductivity type determinant. The semiconductor chips must be made correspondingly larger in size in order to accommodate such wide guard rings. This inconvenience does not occur with the guard trenches, which are capable of creation by known anisotropic etching to a much less width than the guard rings.

Second, formed as above by impurity diffusion, each guard ring becomes either semicircular or elliptical in cross sectional shape. The deepest parts of such guard rings are spaced an unnecessarily long distance away from the cell trenches placed centrally of the semiconductor substrate. The depletion layer is not formed in some such spacings, with a consequent failure in mitigation of field concentrations. The anisotropically etched guard trenches, on the other hand, extend in their depth direction almost at right angles with the substrate surface. The depletion layer is created adjacent the bottoms of the guard trenches for most effective alleviation of field concentrations.

Third, the fabrication of guard rings by impurity diffusion necessitates the semiconductor substrate to be held at high temperatures for prolonged lengths of time. The deeper the guard rings, moreover, the longer must the semiconductor substrate be held heated. Such prolonged heating of the semiconductor substrate brings about an undesired impurity diffusion from one part to another of the substrate. Let us consider an IGBT for instance. An undesired impurity diffusion will occur from n-type buffer region to n$^-$-type base region of the IGBT, to such an extent that the latter region will become unnecessarily high in impurity concentration. The base region with such high impurity concentration will make it difficult for the depletion layer to spread therethrough. The device will then fail to withstand as high voltages as desired. No such prolonged heating is required, and no such undesired impurity diffusion occurs, for creation of the guard trenches complete with the conductors and insulators received therein. Higher voltages can therefore be normally tolerated with the guard trenches than with the guard rings.

Despite all these advantages over the guard rings, the guard trenches as hitherto created possessed some difficulties left unremedied. The guard trenches enable the semiconductor device to withstand a variable voltage depending upon their exact depths and spacings. The creation of the guard trenches to stringent dimensional and positional specifications has therefore been so far essential for provision of semiconductor devices capable of withstanding desired high voltages. Currently, however, there exist limitations that are still insurmountable for fabricating guard trenches to sufficiently close tolerances to provide such rugged semiconductor devices.

The problem of insufficient or unreliable voltage strength at the periphery of the semiconductor substrate is not limited to IGBTs. It has existed with insulated gate transistors other than IGBTs, as well as comparable controllable solid-state switches, thyristors, diodes, and other trench semiconductor devices.

SUMMARY OF THE INVENTION

The present invention has it as an object to improve the voltage-withstanding capability of trench semiconductor devices without relying on the creation of guard trenches to overly stringent dimensional and positional specifications.

Briefly, the invention may be summarized as a trench semiconductor device of improved voltage withstanding capability. Included is a semiconductor substrate which has formed in its central portion at least one cell trench extending to a predetermined depth from one of the pair of opposite major surfaces of the substrate toward the other. The cell trench receives a cell trench conductor via a cell trench insulator. The substrate has also formed in its peripheral portion a plurality of substantially annular guard trenches concentrically surrounding the cell trench and each extending to a predetermined depth from said one major surface of the substrate toward said other. Each guard trench receives a guard trench conductor via a guard trench insulator. Also formed in the substrate are a first semiconductor region of a first conductivity type surrounding part of the cell trench and part of each guard trench, and a second semiconductor region of a second conductivity type, opposite to the first conductivity type, formed in the central portion of the semiconductor substrate so as to extend from said one major surface thereof toward said other to a depth less than the depth of the cell trench, the second semiconductor region being contiguous to the first semiconductor region and surrounding part of the cell trench. A plurality of guard rings of the second conductivity type are formed in the peripheral portion of the semiconductor substrate in alternation with the guard trenches, the guard rings extending from said one major surface of the substrate toward said other to a depth less than the guard trenches and being contiguous to the first semiconductor region. A first electrode on the substrate is electrically coupled to the second semiconductor region, and a second electrode on the substrate is electrically coupled to the first semiconductor region. A plurality of capacitive coupling conductors are formed on the peripheral portion of the semiconductor substrate each for capacitively coupling together two neighboring ones of the guard trench conductors. The potentials of the respective guard trench conductors are individually variable for utmost voltage withstanding capability through adjustment of the capacitive coupling conductors in shape, size, or placement relative to the guard trench conductors.

Preferably, each guard trench conductor is T shaped in cross section, having a web received in one guard trench and a flange formed on the web and projecting from the guard trench. Each capacitive coupling conductor laterally laps over the flanges of two neighboring guard trench conductors via a dielectric.

The invention also provides a method of making the trench semiconductor device of the above summarized construction. After the creation of the guard trench conductors in the guard trenches, with or without the flanges on the guard trench conductors, a dielectric layer is formed all over at least the peripheral portion of the substrate. Then an electroconductive layer is formed on the dielectric layer. Then the electroconductive layer is selectively etched into a desired capacitive coupling conductor pattern.

Thus the capacitive coupling conductors may be appropriately patterned for optimizing the associated capacitive couplings, hence the potentials of the guard trench conductors, and hence the contour of the depletion layer in the neighborhood of the guard trenches. The optimum contouring of the depletion layer is far easier with the capacitive coupling conductors of this invention than without them, because, by virtue of the method of this invention outlined above, the capacitive coupling conductors can be made to much more strict dimensional and positional specifications than the guard trenches. Trench semiconductor devices that can withstand target voltages may therefore be made more easily than heretofore.

The above and other objects, features and advantages of this invention will become more apparent, and the invention itself will best be understood, from a study of the following detailed description and appended claims, with reference had to the attached drawings illustrate some preferable embodiments of the invention and a preferred method of making a trench semiconductor device according to the invention.

DETAILED DESCRIPTION

Figure 1:
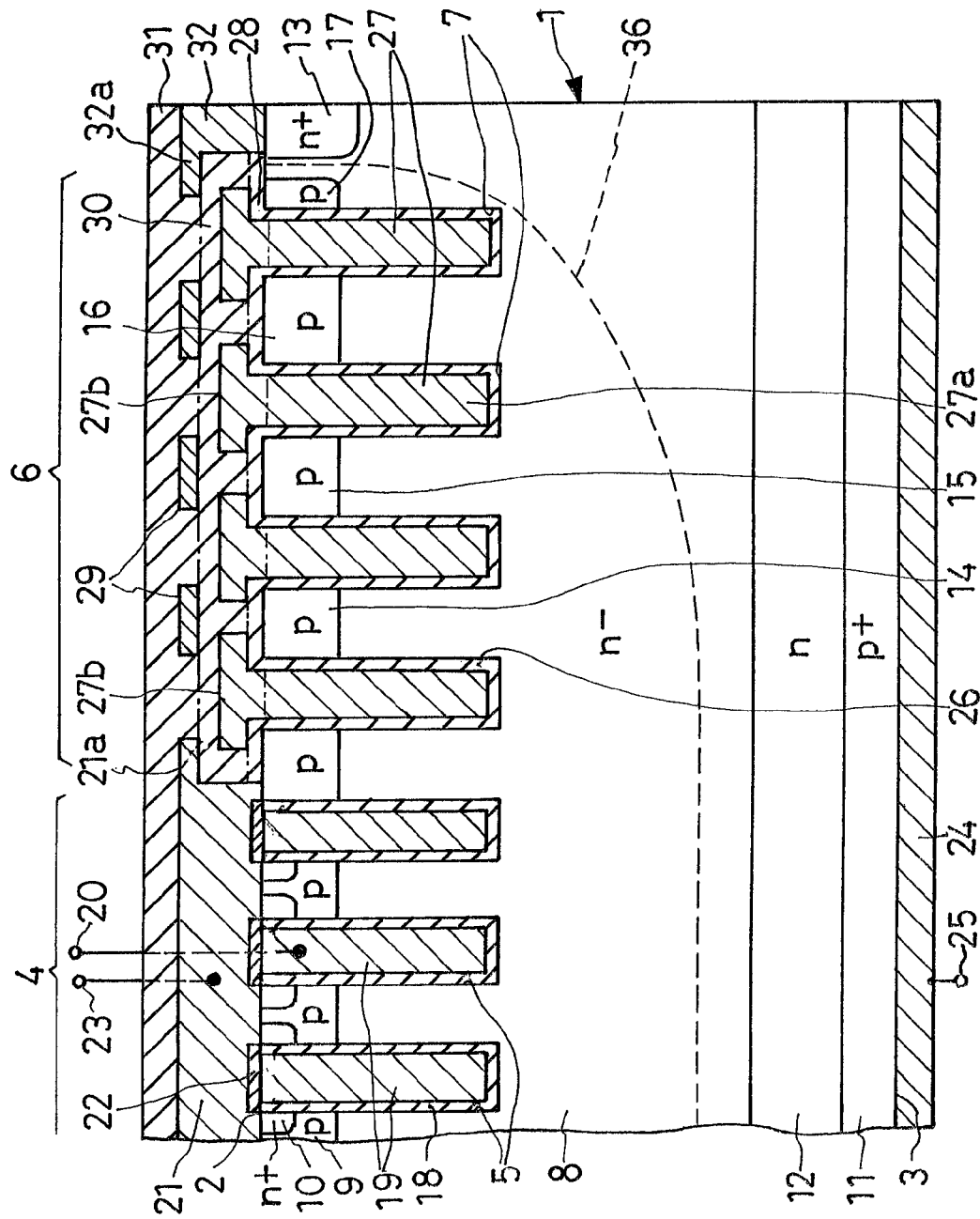
FIG. 1 is a partial, schematic sectional illustration of an IGBT embodying the principles of this invention.

The invention will now be described more specifically as embodied in the IGBT shown in a fragmentary section in FIG. 1. The representative IGBT has a semiconductor substrate 1 of silicon or like material which by itself is depicted in a top plan in FIG. 2. The substrate 1 has a pair of opposite major surfaces 2 and 3, with the first major surface 2 shown directed upwardly in FIG. 1. This first major surface 2 of the substrate 1 will therefore be hereinafter referred to as the top surface, and the second major surface 3 as the bottom surface. FIG. 1 further indicates that the substrate 1 consists of a central portion 4 and an annular peripheral portion 6, with the latter completely encircling the former.

Figure 2:
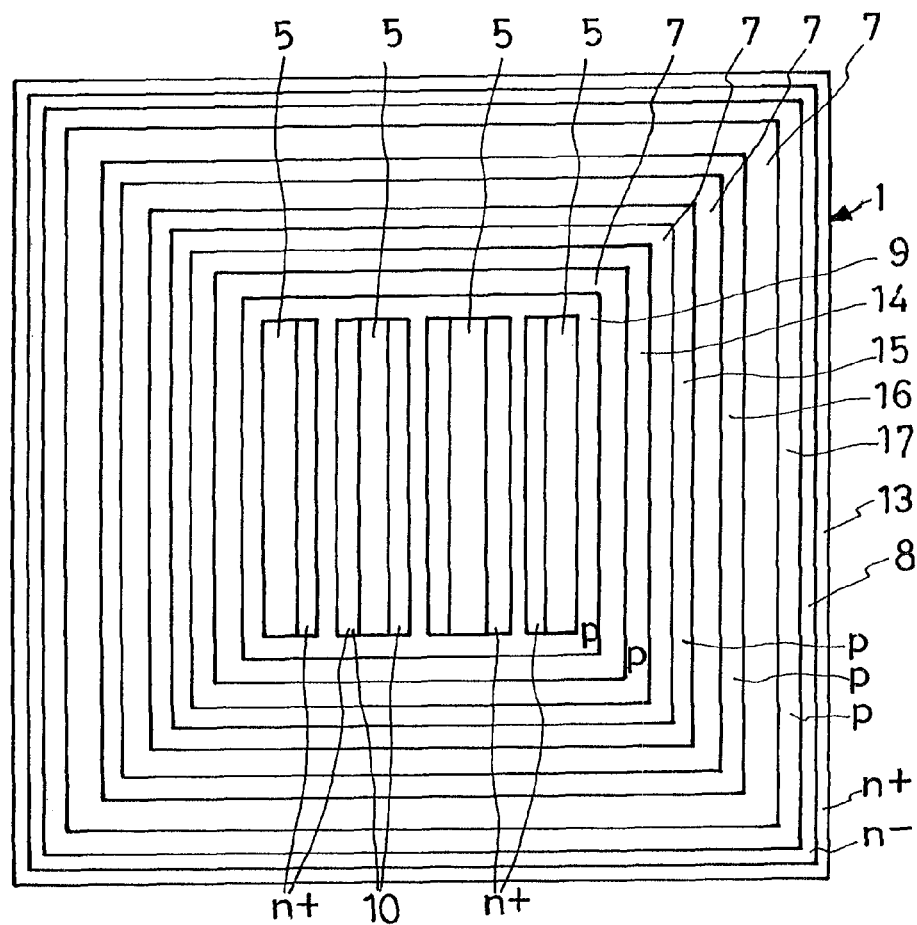
FIG. 2 shows the semiconductor substrate of the IGBT of FIG. 1 in a top plan and on a reduced scale.

The substrate 1 has formed in its central portion 4 a set of, four shown in FIG. 2, cell trenches 5 extending from its top surface 2 and terminating less than halfway down to its bottom surface 3. Formed in the peripheral portion 6, on the other hand, of the substrate 1 are a plurality of, four shown, guard trenches 7 which also extend from the top surface 2 of the substrate to approximately the same depth as the cell trenches 5. Annular in shape, the guard trenches 7 are arranged concentrically around the cell trenches 5.

The cell trenches 5 are shown to be each rectilinear in shape, as seen in a plan view as in FIG. 2, and to extend in parallel spaced relationship to each other. In practice, however, the cell trenches permit a variety of modifications in number, shape, size, and arrangement to meet the specific requirements of each application of the invention. The guard trenches 7 are likewise modifiable and may be adapted, in a manner that will become apparent as the description progresses, to each specific application of the invention for utmost voltage strength of the semiconductor substrate.

With continued reference to both FIGS. 1 and 2 the substrate 1 has formed therein:

1. An $n^-$-type base region 8 as the first semiconductor region occupying a major part of the substrate 1.

2. A p-type base region 9 the second semiconductor region formed in the central portion 4 of the substrate 1 so as to overlie the $n^-$-type base region 8.

3. A plurality of $n^+$-type emitter regions 10 formed on one or both sides of each cell trench 5.

4. A $p^+$-type collector region 11 exposed at the bottom surface 3 of the substrate 1.

5. An n-type buffer region 12 interposed between base region 8 and collector region 11.

6. An annular $n^+$-type channel stop region 13 extending all along the periphery of the top surface 2 of the substrate 1.

7. First, second, third, and fourth p-type guard rings 14, 15, 16 and 17 arranged alternately with the guard trenches 7.

The $n^-$-type base region 8, also known as a drift region, has a donor impurity concentration less than the acceptor impurity concentration of the overlying p-type base region 9. The base region 8 is peripherally exposed at the top surface 2 of the substrate 1.

The p-type base region 9 over the n⁻-type base region 8 is exposed at the top surface 2 of the substrate 1. Although the p-type base region 9 is shown separated into discrete parts by the cell trenches 5 in FIG. 1, all these parts are in fact united as in FIG. 2 via the annular peripheral part of the p-type base region around the cell trenches. Current channels are created in the p-type base region 9 contiguous to the cell trenches 5, so that this base region 9 might also be called a channel region.

Formed in the p-type bas region 9, the n⁺-type emitter regions 10 are also exposed at the top surface 2 of the substrate 1 as well as at the cell trenches 5. The n⁺-type emitter regions 10 are so arranged as to permit the p-type base region 9 to be exposed at the top surface 2 of the substrate 1 both between the individual cell trenches 5 and around all the cell trenches.

The p⁺-type collector region 11 underlies the n⁻-type base region 8 via the n-type buffer region 12 and is wholly exposed at the bottom surface 3 of the substrate 1.

The annular n⁺-type channel stop region 13 is formed along the periphery of the n⁻-type base region 8 and exposed at the top surface 2 of the substrate 1. Higher in n-type impurity concentration than the n⁻-type base region 8, the n⁺-type channelstop region 13 functions to prevent the fourth guard ring 17 from spreading to the periphery of the substrate 1 during its creation by diffusion of a p-type impurity into the substrate. It is therefore desired that the n⁺-type channelstop region 13 be deeper than the p-type base region 9. Contrary to the showing of FIG. 1, in which the n⁻-type base region 8 is partly exposed at the substrate top surface 2 from between n⁺-type channelstop region 13 and fourth guard ring 17, this n⁻-type base region 8 may not necessarily be so exposed; in other words, the n⁺-type channelstop region 13 and fourth guard ring 17 may be disposed contiguous to each other. The n⁻-type base region 8 and n⁺-type channelstop region 13 are alike in conductivity type, so that the channelstop region might be considered part of the base region.

Arranged alternately with the guard trenches 7, the four p-type guard rings 14-17 overlie the n⁻-type base region 8 and are exposed at the substrate top surface 2. These guard rings 14-17 are created at the same time with the p-type base region 9 by diffusion of a p-type impurity into the substrate 1 from its top surface 2, as will be detailed later in the course of the description of a preferred method of making this IGBT, so that they are both of the same depth. Part of the thus diffused p-type region is divided into the guard rings 14-17 as the guard trenches 7 are subsequently etched therethrough into the base region 8. The first three guard rings 14-16 are each disposed between two neighboring guard trenches 7, and the fourth guard ring 17 outwardly of the outmost guard trench 7. As has been mentioned, the n⁻-type base region 8 is exposed in this particular embodiment at the substrate top surface 2 from between n⁺-type channelstop region 13 and fourth guard ring 17, so that the fourth guard ring 17 lies inwardly of the periphery of the substrate 1 and is exposed at the substrate top surface 2.

The cell trenches 5 receive cell trench conductors 19 via cell trench insulators 18. Made for example from polycrystalline silicon (polysilicon or poly-Si), the cell trench conductors 19 are held against both n⁻-type base region 8 and p-type base region 9 via the cell trench insulators 18. As indicated diagrammatically in FIG. 1, the cell trench conductors 19 are electrically coupled to a gate contact 20 in this IGBT application of the invention. When the IGBT is turned on by a gate signal applied to the gate contact 20, n-type current channels are created in the p-type base region 9. Thus the cell trench conductors 19 function as gate electrodes in this embodiment.

FIG. 1 shows an emitter electrode 21 placed on the central portion 4 of the substrate 1. The emitter electrode 21 is in direct contact with both p-type base region 9 and n⁺-type emitter regions 10 but is electrically disconnected by insulators 22 from the cell trench conductors 19 in the cell trenches 5. These insulators 22 are shown in FIG. 1 as lying above the plane of the substrate top surface 2 only because the cell trench conductors 19 fill the cell trenches 5 to the brim in this particular embodiment. As an obvious alternative, then, the cell trench conductors 19 may not fill up the cell trenches 5, and the insulators 22 may be received, either in part or in whole, in the cell trenches. The emitter electrode 21 is shaped and sized to electrically interconnect all the emitter regions 10 and itself electrically coupled to an emitter contact 23.

Formed on the substrate bottom surface 3 is a collector electrode 24 which is held directly against the p⁺-type collector region 11. The collector electrode 24 is electrically coupled to a collector contact 25.

The guard trenches 7 receive guard trench conductors 27 via guard trench insulators 26. Made from polysilicon, for example, the guard trench conductors 27 are held against both n⁻-type base region 8 and p-type guard rings 14-17 via the guard trench insulators 26. Thus the guard trench conductors 27 function as known field plates.

A closer inspection of FIG. 1 will reveal that each guard trench conductor 27 is generally T shaped in cross section, comprising a web $27_a$ and a flange $27_b$. The guard trench conductor webs $27_a$ are wholly received one in each guard trench 7 whereas the guard trench conductor flanges $27_b$ overlie the substrate top surface 2. The guard trench conductor flanges $27_b$ are electrically disconnected from the substrate top surface 2 by substrate insulators 28 of dielectric material. Thus, being electrically isolated from the substrate 1, the guard trench conductors 27 might be called floating electrodes.

Figure 3:
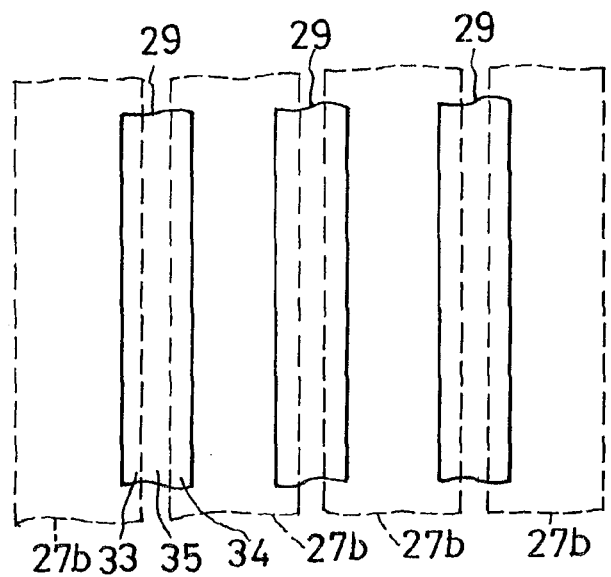
FIG. 3 is a fragmentary, schematic top plan view of an explanatory nature, drawn on approximately the same scale as FIG. 1, showing the positional relationship between the flanges of the guard trench conductors and the capacitive coupling conductors.

Both FIGS. 1 and 3 indicate capacitive coupling conductors 29 of annular shape each extending along and over the spacing between the flanges $27_b$ of two neighboring guard trench conductors 27 for capacitively coupling them together according to a feature of the instant invention. The capacitive coupling conductors 29 are isolated from the guard trench conductors 27 via a second substrate insulator 30 of dielectric material. A third substrate insulator 31 of dielectric material thoroughly covers the capacitive coupling conductors 29 and emitter electrode 21. FIG. 1 shows all the substrate insulators or dielectrics 28, 30 and 31 as being of on-piece construction, and indicates their boundaries by broken lines, for simplicity of illustration. In practice these substrate insulators 28, 30 and 31 are not made all at one time but one after another, as will become apparent from the subsequent description of the inventive method. The capacitive coupling conductors 29 might also be called floating electrodes, being wholly electrically isolated from the substrate 1.

Formed on the n⁺-type channelstop region 13 is an annular peripheral conductor 32 (hereinafter referred to as the channelstop conductor) which is in direct contact with the channelstop region. The channelstop conductor 32 is also covered by the substrate insulator 31.

It will be observed from FIG. 3 in particular that, wider than the spacing between any two neighboring guard trench conductor flanges $27_b$, each capacitive coupling conductor 29 laterally laps over both of them. Therefore, as seen in a plan view as in this figure, each capacitive coupling conductor 29 is notionally divisible into a first side portion 33 overlying one of the two neighboring guard trench conductor flanges $27_b$, a second side portion 34 overlying the other of the two neighboring guard trench conductor flanges $27_b$, and a midportion 35 overlying the spacing between them and joining the first and the second side portions 33 and 34.

Figure 4:
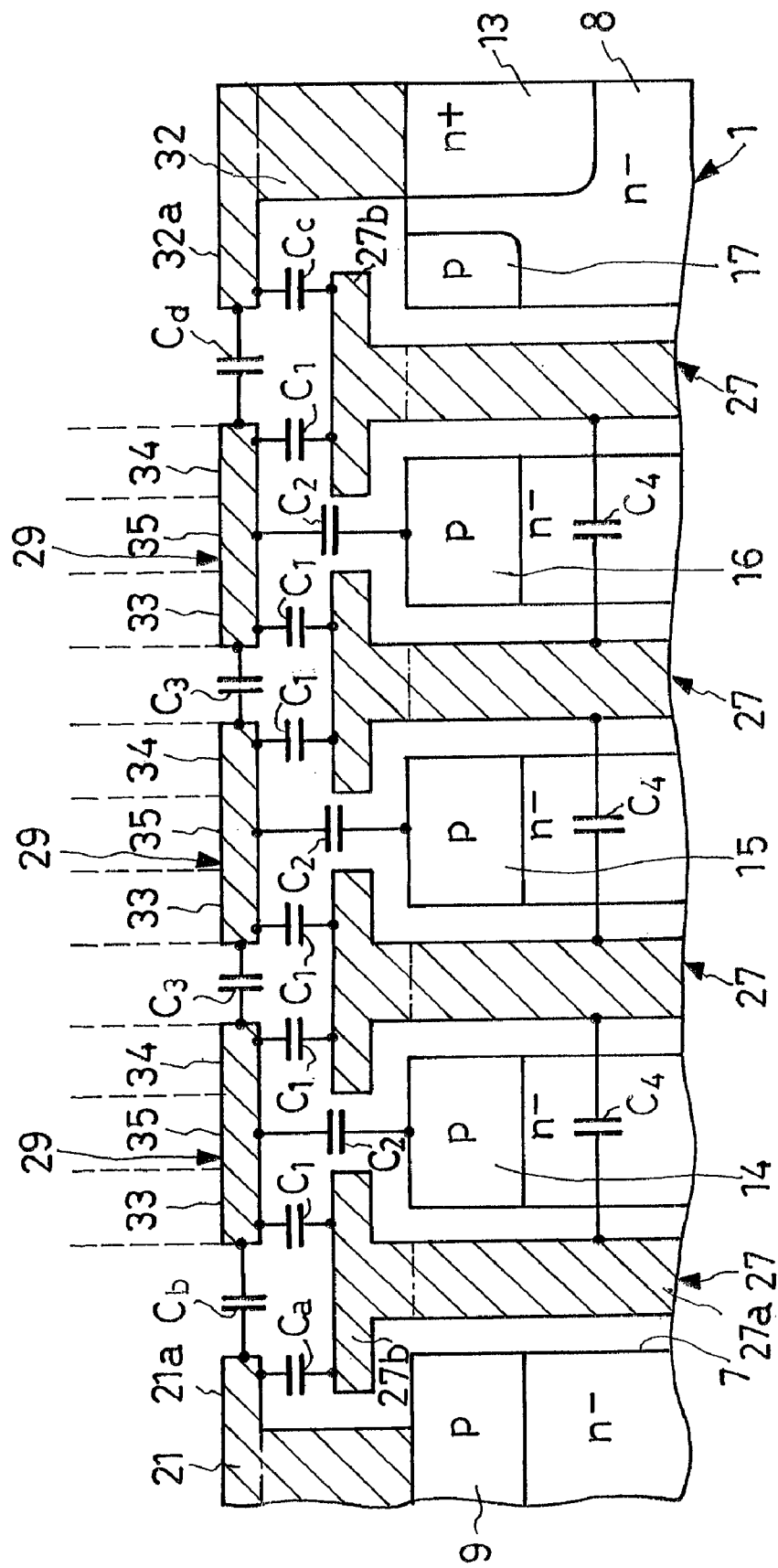
FIG. 4 is a diagram explanatory of capacitive couplings existing in the IGBT of FIG. 1.

Reference may be had to FIG. 4 for an examination of various capacitive couplings existing between emitter electrode 21 and channelstop conductor 32. The inmost guard trench conductor 27, lying next to the emitter electrode 21, has its flange $27_b$ underlapping the flange $21_a$ of the emitter electrode. The inmost guard trench conductor 27 and emitter electrode 21 are therefore coupled together via capacitance $C_a$.

It will also be noted from FIG. 4 that the inmost capacitive coupling conductor 29 is coupled to the emitter electrode 21 via capacitance $C_b$. Further the inmost capacitive coupling conductor 29 has its first side portion 33 coupled to the underlying flange $27_b$ of the inmost guard trench conductor 27 via capacitance $C_1$, its second side portion 34 coupled to the underlying flange $27_b$ of the second inmost guard trench conductor 27 via capacitance $C_1$, and its midportion 35 coupled to the substrate 1 via capacitance $C_2$. The second inmost capacitive coupling conductor 29 is coupled to the first inmost capacitive coupling conductor 29 via capacitance $C_3$, to the two underlying guard trench conductor flanges $27_b$ via capacitances $C_1$, and to the substrate 1 via capacitance $C_2$. The outmost capacitive coupling conductor 29 is coupled to the second inmost capacitive coupling conductor 29 via capacitance $C_3$, to the two underlying guard trench conductor flanges $27_b$ via capacitances $C_1$, to the substrate 1 via capacitance $C_2$, and to the channelstop conductor 32 via capacitance $C_4$. The channelstop conductor 32 is formed to include a flange $32_a$ overhanging the flange $27_b$ of the outmost guard trench conductor 27 and coupled thereto via capacitance Cc.

With the emitter electrode 21 coupled as above to the channelstop conductor 32 via the capacitances $C_a$-$C_d$ and $C_1$-$C_4$, the potentials of the four guard trench conductors 27 are variable stepwise. The guard trench conductors 27 become progressively higher in potential from the inmost one outward with respect to the potential of the emitter electrode 21 when a forward voltage is applied to the IGBT. The potential differences between the guard trench conductors 27 and the channelstop conductor 32, which is practically at the same potential as the n⁻-type base region 8, grow less from the inmost guard trench conductor outward. The guard trench conductors 27 function as aforesaid as field plates with respect to the n⁻-type base region 8 via the guard trench insulators 26. Consequently, with the progressive decline of the potential differences between the guard trench conductors 27 and the channelstop conductor 32 from the inmost one outward, the off-state depletion layer 36 of the IGBT becomes less steep in contour at the peripheral portion 6 of the substrate. Field concentration is thus mitigated.

The four p-type guard rings 14-17 are capacitively coupled as above to both guard trench conductors 27 and capacitive coupling conductors 29. Consequently, the potential differences between these guard rings 14-17 and the n⁻-type base region 8 also decrement from the inmost guard ring outward, causing a gradual diminution in the thickness of the off-state depletion layer created between n⁻-type base region 8 and guard rings 14-17 from p-type base region 9 toward channelstop region 13. The result again is a less steep contour of the depletion layer 36 at the peripheral portion of the substrate 1. Thus the capacitive coupling conductors 29 serve to impart desired potentials both to the guard trench conductors 27, which provide the field plate effect, and to the guard rings 14-17.

The instant applicant has discovered by experiment that the capacitance $C_1$ in FIG. 4 should be several times greater than each of the capacitances $C_2$, $C_3$ and $C_4$. For the best results, if $C_1=1$, then $C_2=\frac{1}{6}$, $C_3=\frac{1}{2}$, and $C_4=\frac{1}{4}$.

Method of Fabrication

Figure 5:
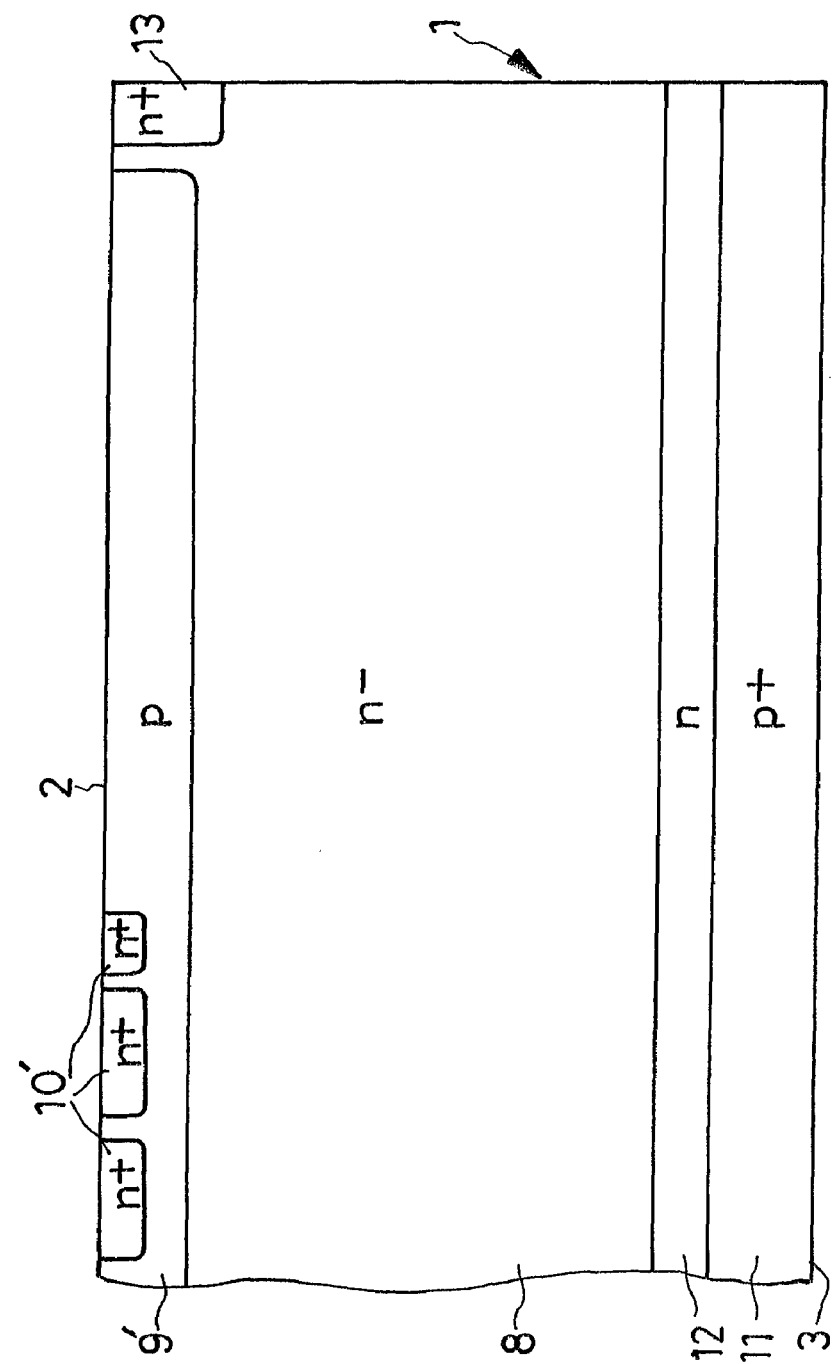
FIG. 5 is a fragmentary section through the semiconductor substrate during the manufacture of the IGBT of FIG. 1.
Figure 6:
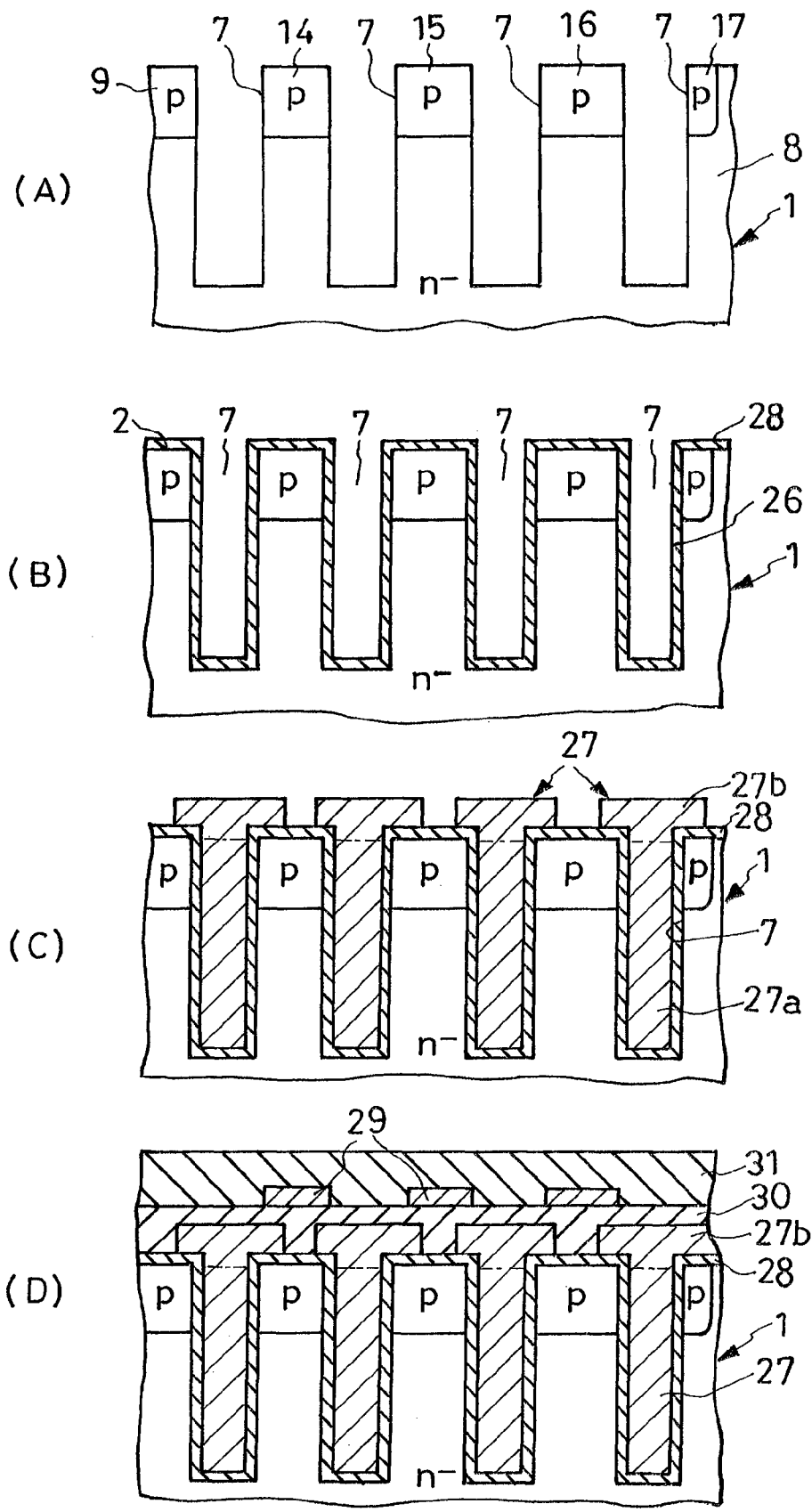
FIG. 6, consisting of (A) through (D), is a series of fragmentary sectional views explanatory of how the IGBT of FIG. 1 is made by the method of this invention.

Reference may be had to both FIGS. 5 and 6 for the following presentation of a preferred method of making the trench IGBT of FIGS. 1-4. There may first be prepared the semiconductor substrate 1 that has been conventionally processed into the state of FIG. 5, having formed therein the n⁻-type base region 8, p-type semiconductor region 9', n⁺-type semiconductor regions 10', p⁺-type collector region 11, n-type buffer region 12, and n⁺-type channelstop region 13. The semiconductor region 9', which is to provide the base region 9 and guard rings 14-17 of FIGS. 1 and 2, is created by diffusion of a p-type impurity into the n⁻-type base region 8 and exposed in part at the substrate top surface 2. The semiconductor regions 10', which are to provide the emitter regions 10, are formed by diffusion of an n-type impurity into the p-type semiconductor region 9'.

Both cell trenches 5 and guard trenches 7, FIGS. 1 and 2, may then be anisotropically etched into the substrate 1 from its top surface 2. FIG. 6 shows at (A) the guard trenches 7 thus created. Both cell trenches 5 and guard trenches 7 should be so deep as to extend through the semiconductor region 9' halfway down into the base region. The semiconductor region 9' will be thus divided into base region 9 and four annular guard rings 14-17.

As will be understood from a study of FIGS. 1, 2 and 3, the cell trenches 5 are etched into and through the n⁺-type semiconductor regions 10'. These semiconductor regions 10' will then be turned into the emitter regions 10 flanking the cell trenches 5. The cell trenches 5 and guard trenches 7 may be created either concurrently or successively.

Then a layer of an insulator such as silicon oxide may be formed all over the surfaces of the cell trenches 5 and guard trenches 7 as well as on the substrate top surface 2. The insulating layer provides the noted cell trench insulators 18, guard trench insulators 26, and first substrate insulators 28. Both guard trench insulators 26 and first substrate insulators 28 are shown also at (B) in FIG. 6. The cell trench insulators 18 and guard trench insulators 26 may of course be formed separately from the first substrate insulators 28, and the cell trench insulators 18 separately from the guard trench insulators 26.

Then the cell trench conductors 19 may be formed in the cell trenches 5, and the guard trench conductors 27 in the guard trenches 7, by filling these trenches with polysilicon. The cell trench conductors 19 and guard trench conductors 27 may also be formed either concurrently or separately. As required, the polysilicon material may be doped with phosphor or the like for providing a desired degree of conductivity after having been introduced into the trenches 5 and 7.

Then the insulators 22, FIG. 1, may be formed on the cell trench conductors 19 in the cell trenches 5. As has been mentioned, the cell trench conductors 19 may or may not fill up the cell trenches 5, and the insulators 22 may or may not be received, either in part or in whole, in the cell trenches. The cell trench conductors 19 are held against all of the n⁻-type base region 8, p-type base region 9, n⁺-type emitter regions 10 via the cell trench insulators 18.

As pictured at (C) in FIG. 6, the guard trench conductors 27 have not only the webs $27_a$, which are wholly received in the guard trenches 7, but also the flanges $27_b$ which are joined to the webs so as to overly the substrate top surface via the first substrate insulators 28. The guard trench conductor flanges $27_b$ may be obtained by forming a layer of polysilicon on the substrate insulators 28 immediately after, or in one step with, the creation of the guard trench conductor webs $27_a$ in the guard trenches 7 and then by selectively etching away the polysilicon layer from over the substrate insulator layer 28.

Then the second substrate insulator 30 may be formed as at (D) in FIG. 6 all over the guard trench conductor flanges $27_b$ as well as in the spacings therebetween.

Then the capacitive coupling conductors 29 may be formed on the second substrate insulator 30 by depositing an electroconductive material, usually metal, thereon and selectively etching away the deposit from over the second substrate insulator.

The fabrication of the capacitive coupling conductors 29 can be concurrent with that of the flange $21_a$, FIGS. 1 and 4, of the emitter electrode 21 and the flange $32_a$ of the channel stop conductor 32. In order to make this possible, the emitter electrode 21 and channelstop conductor 32 may both be fashioned before creation of the capacitive coupling conductors 29 to a preliminary height less than their desired final height by the thickness of the flanges $21_a$ and $32_s$. Then the electroconductive layer may be deposited as above not only on the second substrate insulator 30 but on the preliminarily formed emitter electrode 21 and channelstop conductor 32. Then the deposit may be selectively etched for concurrent fabrication of the capacitive coupling conductors 29, emitter electrode flange $21_a$, and channelstop conductor flange $32_a$. The gate contact 20 and emitter contact 23 may be formed either at the same time with or after the creation of the emitter electrode 21 and channelstop conductor 32.

Then the third substrate insulator 31 may be formed over the capacitive coupling conductors 29 as at (D) in FIG. 6. The third substrate insulator 31 covers not only the capacitive coupling conductors 29 but also the emitter electrode 21 and channelstop conductor 32 as in FIG. 1.

Then the collector electrode 24, FIG. 1, may be formed on the bottom surface 3 of the substrate 1. Alternatively, the collector electrode 24 may be formed either before or at the same time with the emitter electrode 21.

Operation

In order to turn on the IGBT, a control signal may be impressed between gate contact 20 and emitter contact 23, with a drive voltage applied between emitter contact 23 and collector contact 25. The polarity of the drive voltage should be such that the collector contact 25 is positive, and the emitter contact 23 negative. The application of the conduction-causing control signal to the gate contact 20, n-type channels will be created in those parts of the p-type base region 9 which adjoin the cell trenches 5. The result will be the flow of current along the path sequentially comprising the collector electrode 24, $p^+$-type collector region 11, n-type buffer region 12, $n^-$-type base region 8, n-type channels, $n^+$-type emitter regions 10, and emitter electrode 21. What is known as conductivity modulation will occur in the $n^-$-type base region 8 in this on state.

No such conduction modulation will occur in the $n^-$-type base region 8 when the IGBT is off, with no conduction-causing control signal applied to its gate contact 20, because then no channels are created in the p-type base region 9. A depletion layer will appear instead owing to the pn junction between $n^-$-type base region 8 and p-type base region 9. The $n^-$-type base region 8 is less in impurity concentration than the p-type base region 9, so that most of the depletion layer due to the reverse biasing of the pn junction will spread into the base region 8, filling the gaps between the cell trenches 5. These cell trenches serve to make the depletion layer thick enough to enable the IGBT to withstand higher voltages.

The voltage between emitter electrode 21 and collector electrode 24 is higher when the IGBT is off than when it is on. Both channelstop region 13 and channelstop conductor 32 are closer in potential to the collector electrode 24 when the IGBT is off, so that the potential difference between emitter electrode 21 and channelstop conductor 32 is close to that between emitter electrode 21 and collector electrode 24. The capacitive coupling conductors 29 divide the potential difference between emitter electrode 21 and channelstop conductor 32. Consequently, the potentials of the guard trench conductors 27 and guard rings 14-17 change stepwise from the ones closest to the emitter electrode 21 to those closest to the channelstop conductor 32, resulting in the depicted nearly ideal contouring of the depletion layer 36 in the $n^-$-type base region 8.

It will also be appreciated that the guard trenches 7 and guard trench conductors 27 are of approximately the same depth as the cell trenches 5 and cell trench conductors 19. Such guard trenches 7 and guard trench conductors 27 are conducive to the creation in the substrate peripheral portion 6 of a depletion layer that is joined in a streamlined contour to the thick depletion layer adjacent the cell trenches 5.

As has been stated in conjunction with the prior art, the p-type guard rings of approximately the same depth as the cell trenches 7 were conventionally adopted in lieu of the guard trenches 7 for creation of a depletion layer matching that in the substrate central portion 4. The creation of such deep guard rings by impurity diffusion made them unnecessarily wide due to the unavoidable lateral diffusion of the impurity. Such wide guard rings made it imperative to make the semiconductor substrate correspondingly larger in size. The present invention overcomes this inconvenience as the guard trenches 7 may be anisotropically etched into the substrate to much less width than that of the prior art deep guard rings. The substrate 1 can therefore be less in size than that having such prior art guard rings. It is also an advantage of the guard trenches 7 that they can be etched into the substrate 1 without degrading its crystal structure, as contrasted with the conventional guard rings which cause crystal deterioration of the substrate during impurity diffusion therein.

The benefits gained by the above described form of IGBT, and method of making the same, according to the invention may be recapitulated as follows:

1. Being coupled together via the capacitive coupling conductors 29, the guard trench conductors 27 are variable in potential by changing the sizes, shapes and positions of the capacitive coupling conductors, in addition to by changing the sizes, shapes and positions of the guard trench conductors themselves. The off-state pattern of the depletion layer 36 and the field distribution of the $n^-$-type base region 8 are therefore both easily adjustable. By contrast, in the Japanese patent application cited above, the equivalents of the guard trench conductors 27 are connected to the emitter electrode via semi-insulating resistors. The potentials of these guard trench conductor equivalents must be adjusted solely by changing their sizes, shapes and positions. The provision of an ideal depletion layer contour and ideal field distribution is much more difficult according to this prior art than according to the invention, the latter having the capacitive coupling conductors which are readily adjustable in size, shape or position. Thus the invention gives greater latitude to the design and manufacture of the IGBT.

2. Sufficiently great coupling capacitances $C_1$ are obtainable between guard trench conductors 27 and capacitive coupling contactors 29 as the guard trench conductors are flanged.

3. The guard trench conductors 27 have their flanges $27_b$ fabricated by selectively etching into a desired pattern an electroconductive layer that has been formed as a continuation of the guard trench conductor flanges $27_a$. Such adjustable size guard trench conductor flanges $27_b$, perhaps in combination with the adjustable size capacitive coupling conductors 29, permit easy adjustment of the coupling capacitances $C_1$ between guard trench conductors 27 and capacitive coupling conductors 29.

4. The emitter electrode 21 is favorably capacitively coupled to the inmost guard trench conductor 27 as the former has the flange $21_a$ overhanging the flange $27_b$ of the latter.

5. The channelstop conductor 32 is likewise favorably capacitively coupled to the outmost guard trench conductor 27 as the former has the flange $32_a$ overhanging the flange $27_b$ of the latter.

6. The capacitive coupling conductors 29 are capable of concurrent fabrication with the flange $21_a$ of the emitter electrode 21 and the flange $32_a$ of the channelstop conductor 32.

Figure 7:
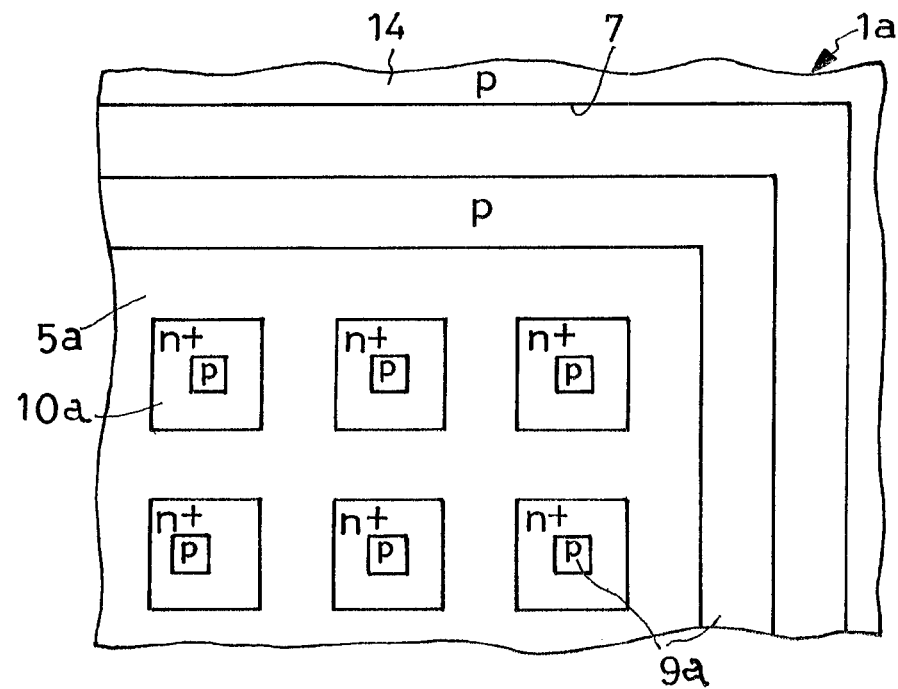
FIG. 7 is a fragmentary top plan view of another preferred form of IGBT according to the invention.

Embodiment of FIG. 7

The IGBT shown here features modified cell trenches $5_a$, modified p-type base region $9_a$, and modified n$^+$-type emitter regions $10_a$ and is otherwise similar in construction to that of FIGS. 1-6. The cell trenches $5_a$ are formed centrally in the semiconductor substrate 1 in latticelike arrangement, bounding islandlike n$^+$-type emitter regions $10_a$ in an array. The p-type base region $9_a$ is exposed in part centrally in each emitter region $10_a$ and in part between the latticed cell trenches $5_a$ and the inmost annular guard trench 7.

It is understood that the cell trenches $5_a$ receive cell trench conductors via cell trench insulators, and the guard trenches 7 receive the guard trench conductors via the guard trench insulators. Thus the second preferred form of IGBT offers the same benefits as the first.

Figure 8:
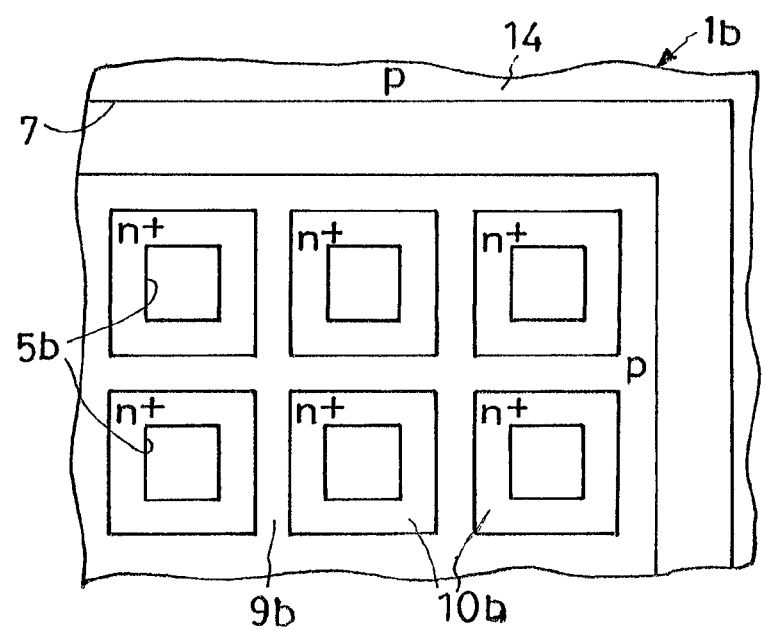
FIG. 8 is a fragmentary top plan view of still another preferred form of IGBT according to the invention.

Embodiment of FIG. 8

Another preferred form of IGBT according to the invention has a latticelike p-type base region $9_b$ defining an array of islandlike n$^+$-type emitter regions $10_b$ as in FIG. 8. Wells $5_b$, functionally equivalent to the cell trenches 5 or $5_a$ of the foregoing embodiments, are formed centrally one in each emitter region $10_b$. All the other details of construction, including the annular guard trenches 7 around the array of wells $5_b$, are as previously set forth with reference to FIGS. 1-6.

It is here again understood that the wells $5_b$ receive well conductors via well insulators, just as the cell trenches of the foregoing embodiments receive cell trench conductors via cell trench insulators, and that the guard trenches 7 receive the guard trench conductors via the guard trench insulators. Thus the third preferred form of IGBT also offers the same benefits as the first.

Figure 9:
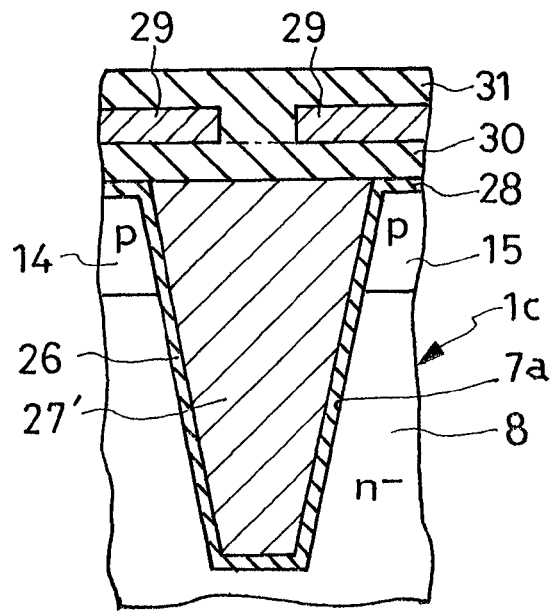
FIG. 9 is a fragmentary sectional view of a modified guard trench according to the invention.

Embodiment of FIG. 9

The guard trenches 7 of the FIGS. 1-6 embodiment and the guard trench conductors 27 received therein are both modifiable in cross sectional shape as indicated at $7_a$ and 27' in FIG. 9. The modified guard trenches $7_a$ and guard trench conductors 27' taper in width as they extend in their depth direction. The capacitive coupling conductors 29 are arranged so as to span the opposite edges of the wider ends of the guard trench conductors 27'.

The tapering guard trenches $7_a$ and tapering guard trench conductors 27' therein function just like their FIGS. 1-6 counterparts 7 and 27. As a further modification of this FIG. 9 embodiment, the guard trenches may taper stepwise instead of linearly.

Figure 10:
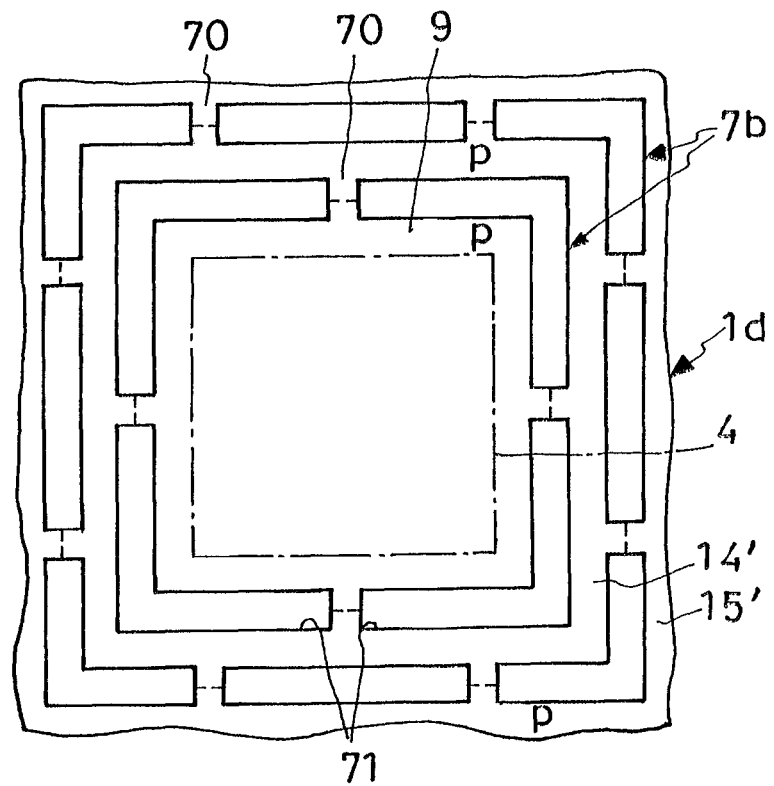
FIG. 10 is a fragmentary top plan view of a further preferred form of IGBT according to the invention.

Embodiment of FIG. 10

The annular guard trenches 7 or $7_a$ suggested hereby need not necessarily be each continuous as drawn in FIG. 2 but may be each comprised of several discrete segments as seen in a plan view as in FIG. 10. It will be observed from this figure that each guard trench $7_b$ is made up from discrete segments 71 of annular arrangement around the central substrate portion 4 where the cell trenches may be formed either as at 5 in FIG. 2, at $5_a$ in FIG. 7, or at $5_b$ in FIG. 8.

The spaces 70 between each annular row of guard trench segments 71 are filled by p-type regions that have been formed concurrently with p-type guard rings 14', 15' and so forth which in turn have been formed concurrently with the p-type base region 9. The base region 9 is therefore joined to all the guard rings 14', 15' . . . via the spaces between each annular row of guard trench segments 71. The spaces 70 between the guard trench segments should be sufficiently small to assure the creation of the streamlined off-state depletion layer 36, FIG. 1, in the underlying n$^-$-type base region 8. As long as this condition is met, the segmental guard trenches $7_b$ are just as effective as the continuous guard trenches 7. It is even possible to shape the guard trench segments in circles, ellipses or squares as seen in a plan view as in FIG. 10, instead of rectangles as shown.

The broken lines shown at the spaces between the inmost annular row of guard trench segments 71 represent a notional boundary between the p-type base region 9 and the inmost p-type guard ring 14'. Similarly, the broken lines between the second inmost annular row of guard trench segments 71 represent a notional boundary between the inmost p-type guard ring 14' and the second inmost p-type guard ring 15', and so forth.

Figure 11:
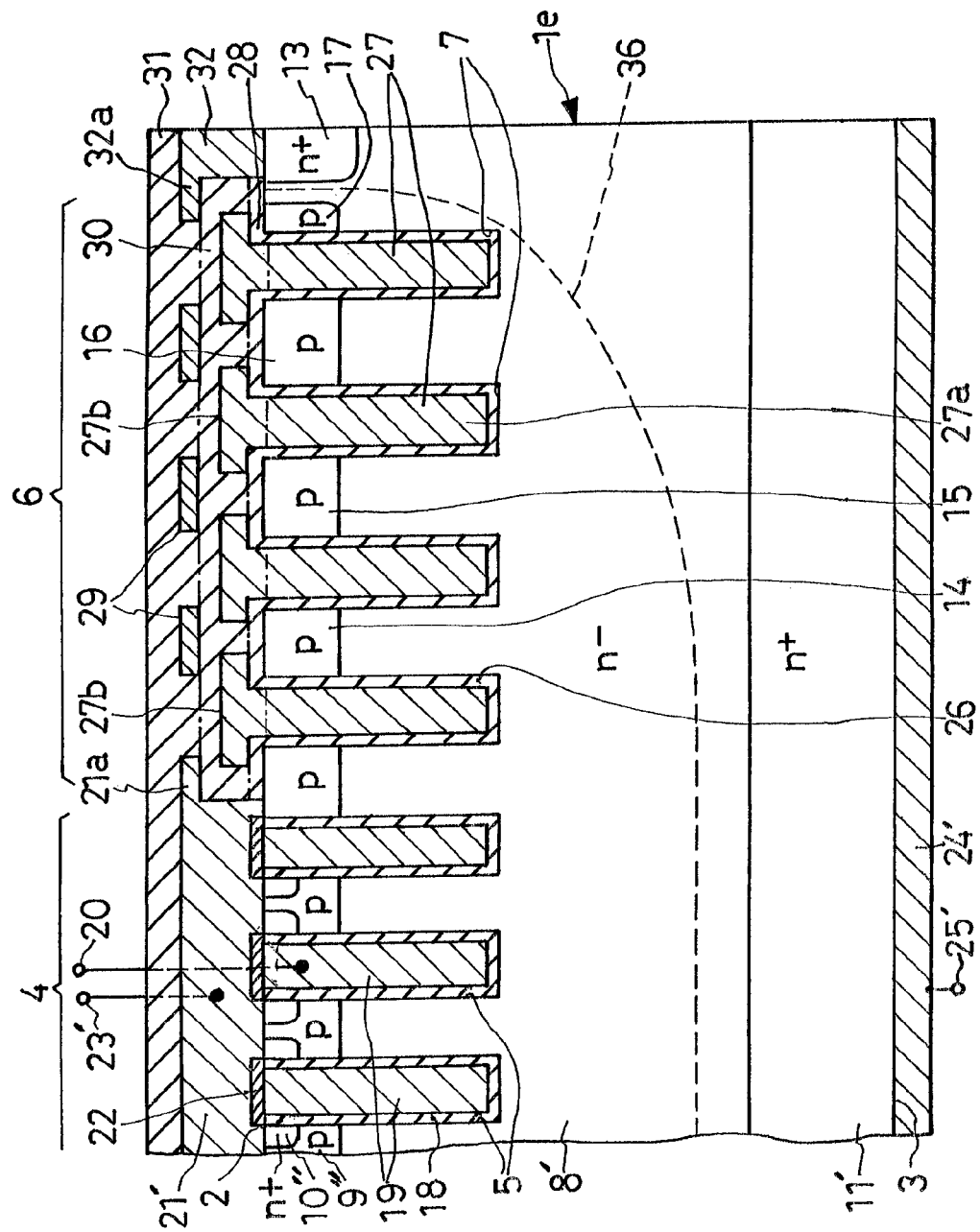
FIG. 11 is a view similar to FIG. 1 but showing the invention as applied to an insulated-gate field-effect transistor.

Embodiment of FIG. 11

The invention is shown here as applied to an insulated-gate field-effect transistor (IGFET). A comparison of FIGS. 1 and 11 will reveal that the IGFET structurally differs from the IGBT only in that the IGFET substrate $1_e$ does not have the n-type buffer region 12 of the IGBT substrate 1 and does have an n$^+$-type drain region 11' in place of the p$^+$-type collector region 11. Although the other parts of the IGFET and IGBT are analogous, the n$^+$-type base region 8, p-type base region 9, n$^+$-type emitter region 10, emitter electrode 21, emitter contact 23, collector electrode 24 and collector contact 25 of the FIG. 1 IGBT may be renamed and redesignated as n$^-$-type drift region 8', p-type body region 9''', n$^+$-type source region 10''', source electrode 21', source contact 23', drain electrode 24', and drain contact 25'.

When this IGFET is on, current will flow along the path sequentially comprising the n-type drain region 11', n$^-$-type drift region 8', channels in the p-type body region 9''', and n$^+$-type source region 10'''. When the IGFET is off, the depletion layer 36 due to the reverse biasing of the pn junction between n$^-$-type drift region 8' and p-type body region 9''' will appear so as to fill the spaces between cell trenches 5 and guard trenches 7 as in the FIG. 1 IGBT, enabling this IGFET

Figure 12:
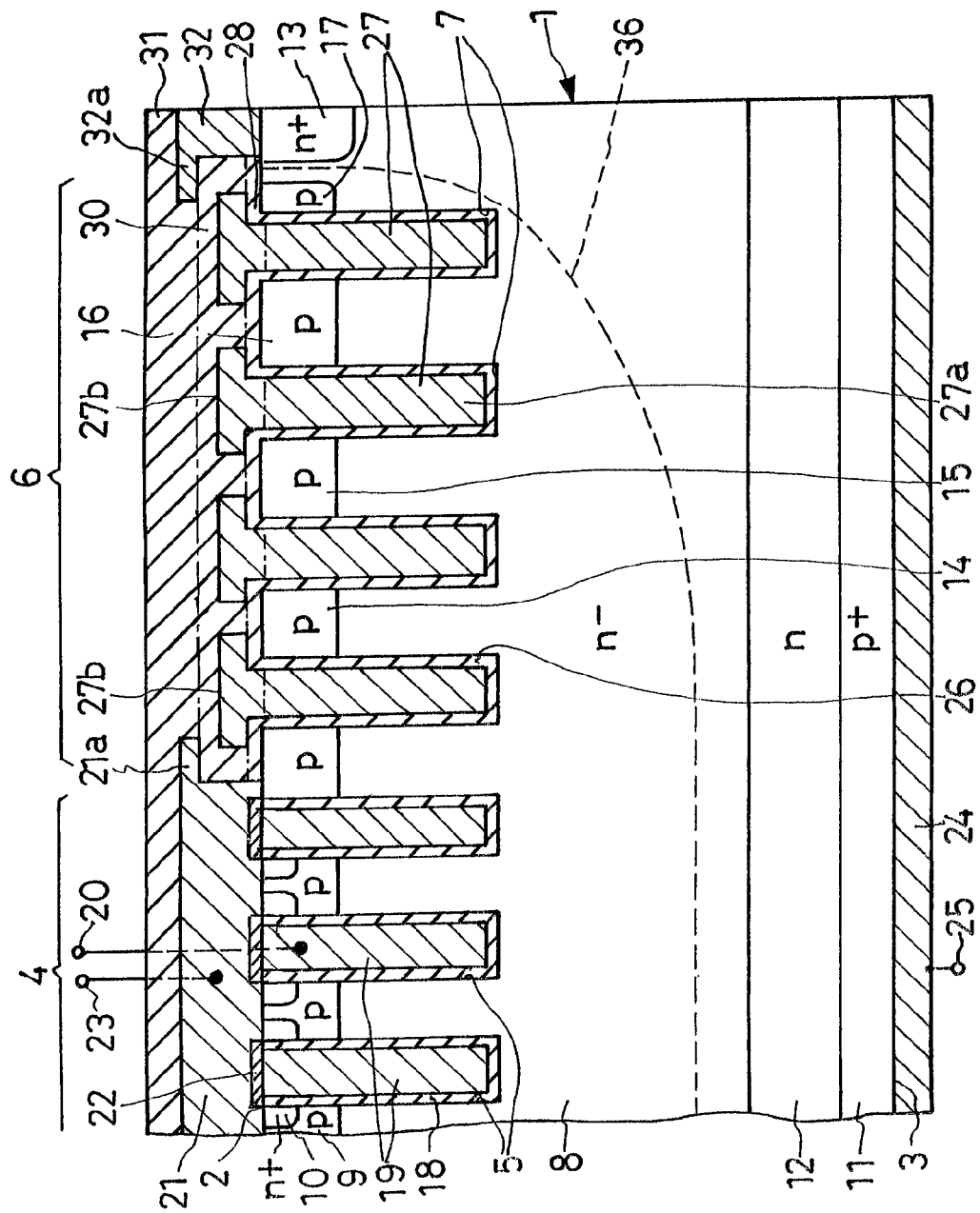
FIG. 12 is also a view similar to FIG. 1 but showing a still further modification of the IGBT.

Embodiment of FIG. 12

The capacitive coupling conductors 29 of the FIG. 1 IGBT are eliminable as in the embodiment of FIG. 12, which is otherwise identical in construction with that of FIG. 1. Serving the purposes of the capacitive coupling conductors in their stead are the flanges $27_b$ of the guard trench conductors 27. The guard trench conductor flanges $27_b$ are placed sufficiently close to each other to accomplish the capacitive coupling of the guard trench conductors 27.

The absence of the capacitive coupling conductors 29 makes this IGBT simpler in construction and easier and more economical of manufacture. The guard trench conductor flanges $27_b$ are, moreover, easily adjustably variable in size and relative placement for optimizing the potentials of the guard trench conductors 27. The teachings of FIG. 12 is similarly applicable to IGFETs.

Possible Modifications

Notwithstanding the foregoing detailed disclosure it is not desired that the present invention be limited by the exact showings of the drawings or the description thereof. The following is a brief list of possible modifications, alterations or adaptations of the illustrated embodiments of the invention which are all believed to fall within the purview of the claims annexed hereto:

1. In the FIG. 1 embodiment, either or both of a part of the $n^-$-type base region 8 and a part of n-type buffer region 12 could be coupled directly to the collector electrode 3.

2. The invention is applicable to semiconductor devices other than IGBTs and IGFETs, such as diodes and thyristors. For example, for providing a diode built on the principles of this invention, the p-type base region 9 of the FIG. 1 embodiment may be connected to the anode electrode, and the $n^-$-type base region 8 or the n-type buffer region 12 to the cathode; that is, both $n^+$-type emitter regions 10 and $p^+$-type collector region 11 may be omitted from the FIG. 1 embodiment.

3. The flanges $27_b$ of the guard trench conductors 27 will be unnecessary if the guard trench conductors can nevertheless be capacitively coupled together by the capacitive coupling conductors 29.

4. Both $n^+$-type channelstop region 13 and channelstop conductor 32 may be omitted.

5. An additional conductor (floating electrode) similar to the capacitive coupling conductors 29 may be employed for capacitively coupling together the emitter electrode 21 and inmost guard trench conductor 27.

6. An additional conductor similarly to the capacitive coupling conductors 29 may likewise be employed for capacitively coupling together the outmost guard trench conductor 27 and channelstop conductor 32.

What is claimed is:

1. A trench semiconductor device of improved voltage withstanding capability, comprising:
   (a) a semiconductor substrate having a central portion and an annular peripheral portion between a pair of opposite major surfaces;
   (b) there being at least one cell trench formed in the central portion of the semiconductor substrate so as to extend to a predetermined depth from one of the major surfaces thereof toward the other;
   (c) a cell trench insulator;
   (d) a cell trench conductor received in the cell trench via the cell trench insulator;
   (e) there being a plurality of substantially annular guard trenches formed in the peripheral portion of the semiconductor substrate so as to extend to a predetermined depth from said one major surface of the semiconductor substrate toward said other, the guard trenches surrounding the cell trench;
   (f) a plurality of guard trench insulators;
   (g) a plurality of guard trench conductors received one in each guard trench via one guard trench insulator, wherein each guard trench conductor comprises a web received in one guard trench and a flange formed on the web and projecting from the guard trench, wherein the flanges are placed sufficiently close to each other to accomplish the capacitive coupling of the guard trench conductors;
   (h) a first semiconductor region of a first conductivity type formed in the semiconductor substrate so as to surround part of the cell trench and part of each guard trench;
   (i) a second semiconductor region of a second conductivity type, opposite to said first conductivity type, formed in the central portion of the semiconductor substrate so as to extend from said one major surface thereof toward said other to a depth less than the depth of the cell trench, the second semiconductor region being contiguous to the first semiconductor region and surrounding part of the cell trench;
   (j) a plurality of guard rings of said second conductivity type formed in the peripheral portion of the semiconductor substrate in alternation with the guard trenches, the guard rings extending from said one major surface of the substrate toward said other to a depth less than the guard trenches and being contiguous to the first semiconductor region;
   (k) a first electrode on the semiconductor substrate electrically coupled to the second semiconductor region;
   (l) a second electrode on the semiconductor substrate electrically coupled to the first semiconductor region; and
   (m) an annular peripheral conductor formed on said one major surface of the semiconductor substrate so as to surround the guard trenches, the peripheral conductor being electrically coupled to the first semiconductor region of the semiconductor substrate,
   wherein the guard trench conductors include an outmost guard trench conductor which is closest to the peripheral conductor, and wherein the outmost guard trench conductor is capacitively coupled to the peripheral conductor.

2. A trench semiconductor device as defined in claim 1, further comprising a layer of insulator disposed between the semiconductor substrate and each flange of the guard trench conductors.

3. A trench semiconductor device as defined in claim 2, further comprising a second layer of insulator disposed between two neighboring flanges of the guard trench conductors.

4. A trench semiconductor device as defined in claim 1, further comprising a layer of insulator disposed between two neighboring flanges of the guard trench conductors.

5. A trench semiconductor device as defined in claim 1, wherein the guard trench conductors include an inmost guard trench conductor which is closest to the first electrode, and wherein the inmost guard trench conductor is capacitively coupled to the first electrode.

6. A trench semiconductor device as defined in claim 5, wherein the inmost guard trench conductor and the first electrode are capacitively coupled together by having parts arranged in overlapping relationship to each other via a dielectric.

7. A trench semiconductor device as defined in claim 1, wherein the outmost guard trench conductor and the peripheral conductor are capacitively coupled together by having parts arranged in overlapping relationship to each other via a dielectric.

8. A trench semiconductor device as defined in claim 1, further comprising:

a third semiconductor region of the first conductivity type formed in the second semiconductor region and disposed contiguous to the cell trench, the third semiconductor region being electrically coupled to the first electrode; and a control contact electrically coupled to the cell trench conductor.

9. A trench semiconductor device as defined in claim 8, further comprising a fourth semiconductor region of the second conductivity type formed in the semiconductor substrate and disposed between the first semiconductor region and said other major surface of the substrate, the fourth semiconductor region being electrically coupled to the second electrode.

* * * * *